United States Patent [19]
Tagomori

[11] Patent Number: 5,761,321
[45] Date of Patent: Jun. 2, 1998

[54] VOLUME CONTROLLER

[75] Inventor: Reiji Tagomori, Saitama-ken, Japan

[73] Assignee: Kabushiki Kaisha Toshiba, Kanagawa-ken, Japan

[21] Appl. No.: 365,477

[22] Filed: Dec. 28, 1994

[30] Foreign Application Priority Data

Dec. 28, 1993 [JP] Japan ................... 5-334183

[51] Int. Cl.$^6$ ........................................... H03G 3/00
[52] U.S. Cl. .................................... 381/104; 381/107
[58] Field of Search ............................ 381/104, 107, 381/101, 102; 333/14

[56] References Cited

U.S. PATENT DOCUMENTS 3,796,945  3/1974  Feldman ................... 381/104

FOREIGN PATENT DOCUMENTS

0 146 355  6/1985  European Pat. Off. .
0 548 479  6/1993  European Pat. Off. .
2 068 186  8/1981  United Kingdom .

*Primary Examiner*—Minsun Oh Harvey
*Attorney, Agent, or Firm*—Cushman Darby & Cushman IP Group of Pillsbury Madison & Sutro LLP

[57] ABSTRACT

A volume controlire include a volume regulating circuit having an input terminal connected to an audio signal source and a control terminal to which a volume regulating voltage is supplied, a circuit for supplying parallel data in multiple bits, a Df/A conversion circuit having including multiple current circuits formed in parallel corresponding to every bit of the parallel data, for ON/OFF controlling the current circuits according to respective bit data and for supplying total sun current flowing through these current circuits, a control circuit for controlling output current from the D/A conversion circuit to non-linear current by switching current volumes of respective current circuits corresponding to the most significant bit data out of the parallel data, and a circuit for generating the volume regulating voltage by converting the output current from the D/A conversion circuit into voltage.

4 Claims, 11 Drawing Sheets

VOLUME CONTROLLER

FIELD OF THE INVENTION

The present invention relates to a volume controller which is used in sound processing circuits, etc., and more particularly to a volume controller for logically controlling sound volume like a bus line sound processor IC.

BACKGROUND OF THE INVENTION

Conventionally, various audio ICs have been developed by a method, such as a spectrum analysis of audio frequency. The sound volume or tone quality of a sound source has been studied based on an audio signal transmission system, for instance, a human hearing organ or a signal transmission medium.

It is generally said that if the volume level of a sound source is attenuated by 20 dB, the sound is heard by the human hearing organ at nearly half the volume level. This relationship is expressed numerically by the following logarithmic expression:

[Expression 1]

$$A = -20 \cdot \log_{10} X$$

where, A is the hearing sensitivity and X is the sound source intensity.

A circuit conforming to this characteristic may be said to be an ideal sound volume controller.

Figure 1:
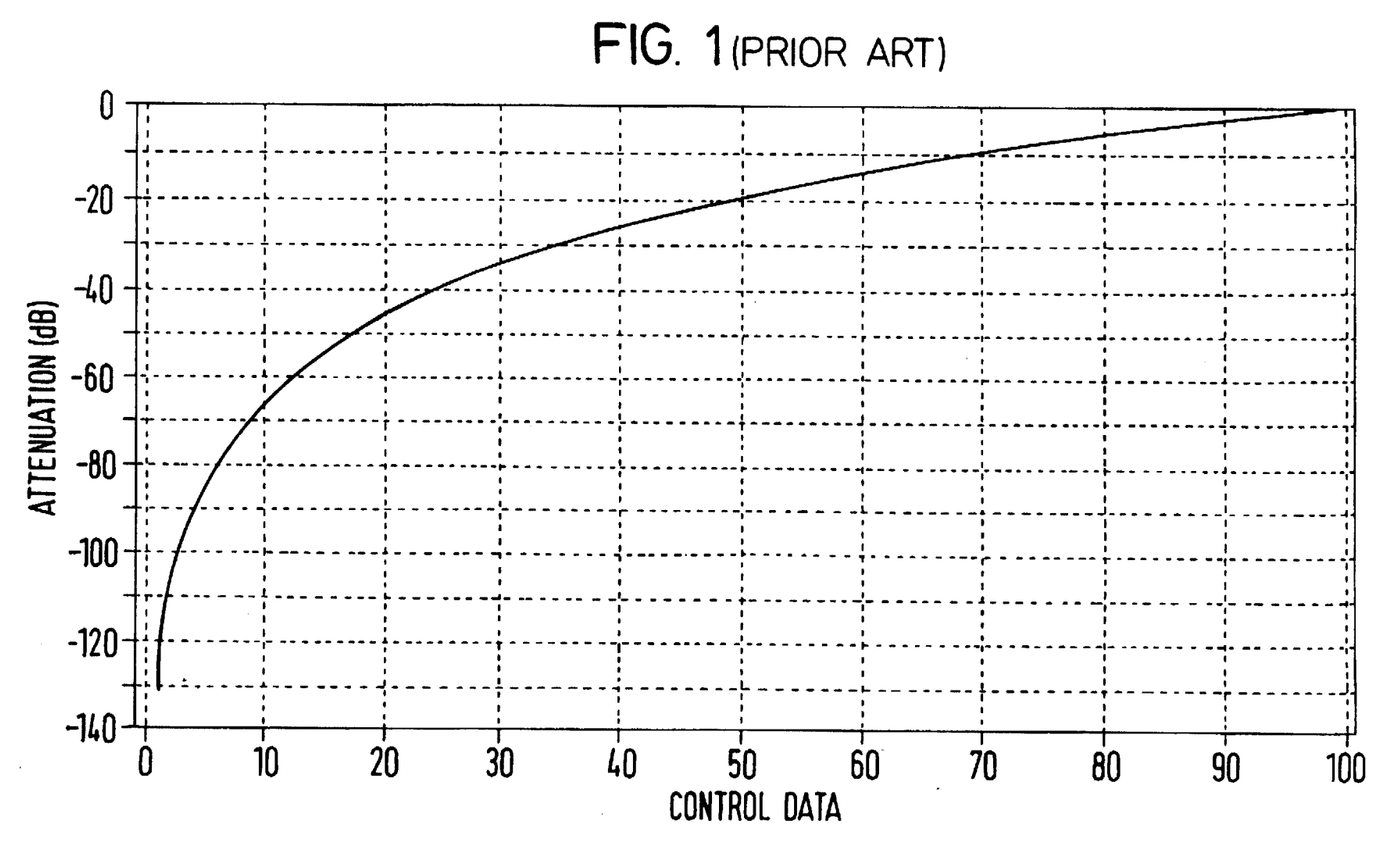
FIG. 1 is a diagram showing an ideal volume control characteristic.

An ideal volume control curve is shown in FIG. 1. The Y-coordinate shows volume attenuations and the X-coordinate shows gradations.

Figure 2:
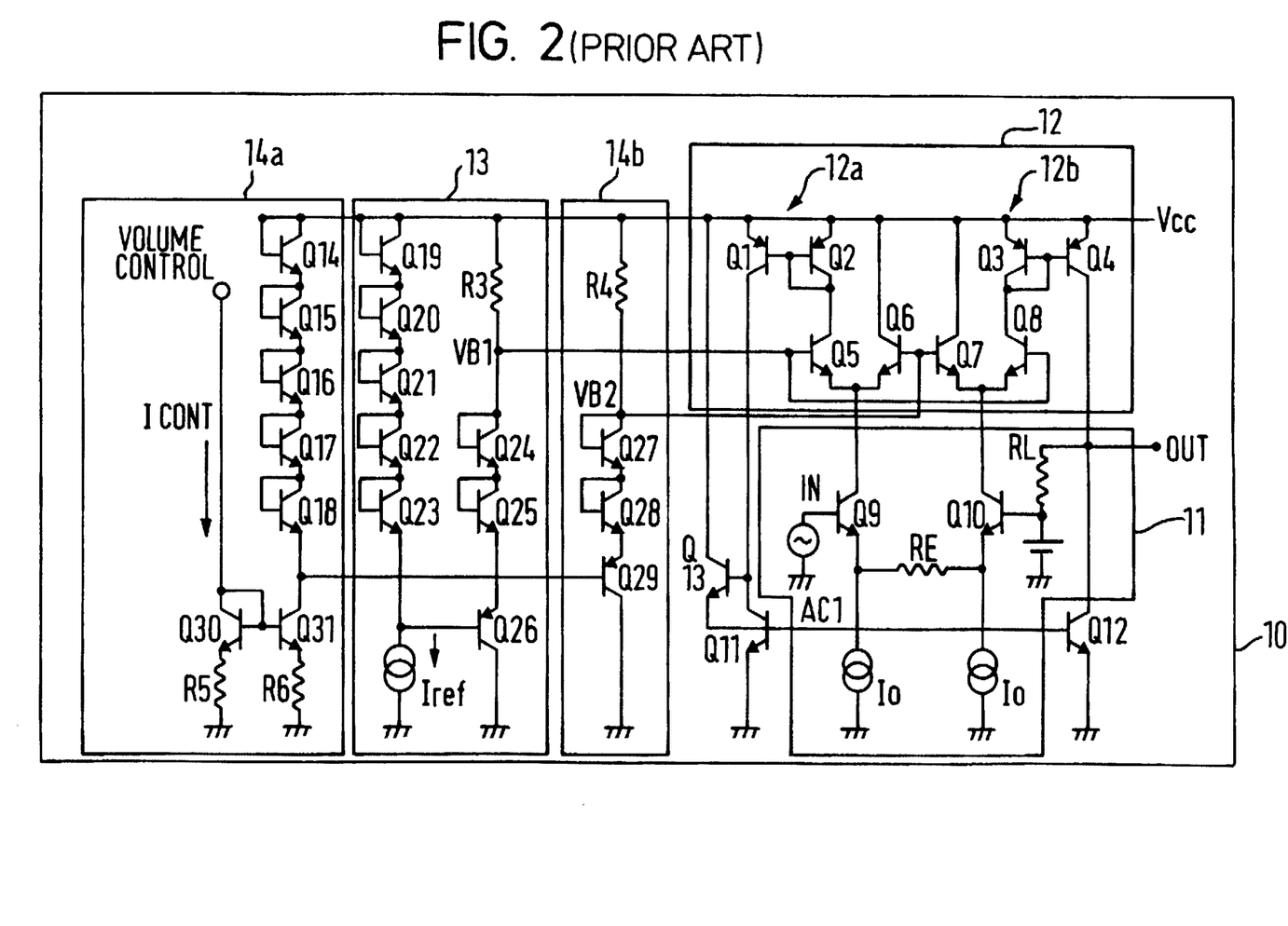
FIG. 2 is a circuit diagram showing a conventional volume controller.

A typical circuit used in a volume controller IC is shown in FIG. 2. This circuit regulates sound volume by setting the control current ICONT which will be explained later with reference to the drawings.

An input audio signal IN from a sound source AC1 is amplified in a differential amplifier circuit 11 which is comprised of an emitter resistor RE commonly connected to the emitters of respective transistors, a current source IO, and a load resistor RL to provide an output audio signal OUT.

The collectors of transistors Q9, Q10 of the differential amplifier circuit 11 are commonly connected to a DC power source Vcc via differential circuits 12a, 12b of a bias regulating circuit 12.

The differential circuits 12a, 12b for biasing are provided with two pairs of transistors Q5–Q6 and Q7–Q8, a DC power source Vcc to be connected to the collectors of the transistors Q6 and Q7, collector-base connected diodes Q2, Q3 connected to the collectors of transistors Q5, Q8, and transistors Q1, Q4 of which bases are connected to the diodes Q2, Q3 and their emitters are connected to the DC power source Vcc.

The emitters of transistors Q11, Q12 which promote the external load driving capacity are connected to a reference potential and their bases are connected to the emitter of a transistor Q13. The base of transistor Q13 is connected to the collector of transistor Q11 and the collector of transistor Q13 is connected to the DC power source Vcc.

The bases of transistors Q5–Q8 in the bias regulating circuit 12 are connected to a reference current circuit 13 that provides a reference current Iref, control current setting circuits 14a, 14b which are set by the control current ICONT, and base potentials VB1, VB2 which are set by the reference current Iref and the control current ICONT, respectively.

The reference current circuit 13 is provided with collector-base connected diodes Q19–Q23 which are connected to the DC power source Vcc and the reference current source Iref, and is comprised of a transistor Q26 whose base is connected to the reference current source Iref, collector is connected to the reference potential source, anD emitter is connected to two stack-connected diodes Q24, Q25; a resistor R3; and the DC power source Vcc. The emitter voltage VB1 of transistor Q26 of the reference current circuit 13 is supplied to the base of transistor Q5 of the differential circuit 12a of the bias regulating circuit 12 and the base of transistor Q8 of the other differential circuit 12b via the diodes Q24, Q25.

Similar to the reference current circuit 13, the control current setting circuit 14a is provided with a constant current source comprising a transistor Q31 and five stack-connected diodes Q14–Q18. The base current of transistor Q31 is controlled by the control current ICONT, while the emitter voltage of transistor Q31 regulates a voltage VB2 which will be described later. Further, the control current setting circuit 14b is comprised of two stack-connected diodes Q27, Q28, a transistor Q29 and a resistor R4, which are connected in series. The node connecting diode Q27 and resistor R4 is connected to the bases of transistors Q6, Q7 of the differential circuits 12a, 12b.

A volume control circuit 10 attenuates the weighted sound volume by approximately 20 dB when the volume level is suppressed from the maximum level to the medium level. If the volume is further suppressed lower than the medium level, the volume control circuit 10 sharply attenuates the sound volume.

This is because if there is insufficient attenuation, a residual sound is heard. In order to eliminate this residual sound, the two series of the collector-base connected diodes Q14–Q18 and Q19–Q23 are each stacked in five layers.

Hereinafter, potential relations of PN junction systems will be explained in detail based on electronic physical properties.

It is assumed that the collector current of a bipolar transistor is IC; the saturated current of a PN junction in the reverse direction is IS; the coefficient of heat of molecular motion, Boltzmann's constant, is K; the absolute temperature, expressed in Kelvin, is T; the electronic charge is q; voltages between collector, base and emitter are expressed by adding a subscript of C for collector, B for base and E for emitter (for instance, VBE denotes the base to emitter potential); the reference current source is Iref; the control current is ICONT; and the emitter to collector current amplification factor of a bipolar transistor is α.

If input voltages of the differential circuits 12a, 12b are VB1, VB2 (see FIG. 2), the following relationships are established:

[Expression 2]

$$VB1 = V_\alpha - 5 \times V_{BE} + 3 \times V_{BE}$$

$$= V_\alpha - 5 \times h \times \ln\left(\frac{I_{ref}}{I_S}\right) + 3 \times V_{BE}$$

$$VB2 = V_\alpha - 5 \times V_{BE} + 3 \times V_{BE}$$

$$= V_\alpha - 5 \times h \times \ln\left(\frac{I_{cont}}{I_S}\right) + 3 \times V_{BE}$$

$$h = \frac{kT}{q}$$

Calculating a difference according to the above expression yields:

$$\frac{\Delta V_B}{h} = \ln\left(\frac{I_{ref}}{I_{cont}}\right)^5 \quad \text{[Expression 3]}$$

Further, when the current characteristic of the PN junction system is expressed by the following exponential function:

$$I_S\left(\exp\left(\frac{V_{BE}}{h}\right) - 1\right) = I_0 \quad \text{[Expression 4]}$$

the following expression is calculated:

$$I_C = \frac{\alpha \cdot I_0}{1 + \exp\left(\frac{\Delta V_B}{h}\right)} = \frac{\alpha \cdot I_0}{1 + \exp\left(\frac{I_{ref}}{I_{cont}}\right)^5} \quad \text{[Expression 5]}$$

The DC voltage and the collector output signal are fed back to the base of the transistor Q10 of the differential amplifier circuit 11 via the load resistor RL. The amplification gain of the audio signal is calculated according to the emitter resistor RE, the load resistor RL and the emitter current, i.e., the ratio of the current source IO to the collector current IC derived from the above equation 5. The gain expression converted into the decibel unit is shown as follows:

$$\text{Gain} = 20 \cdot \log\left(\frac{V_{out}}{V_{in}}\right) = 20 \cdot \log\left(\frac{I_C}{I_0} \cdot \frac{R_L}{R_E}\right) \quad \text{[Expression 6]}$$

From the above expression, it can be seen that Iref/Icont −1.55 is sufficient for achieving an attenuation of 20 dB.

Figure 3:
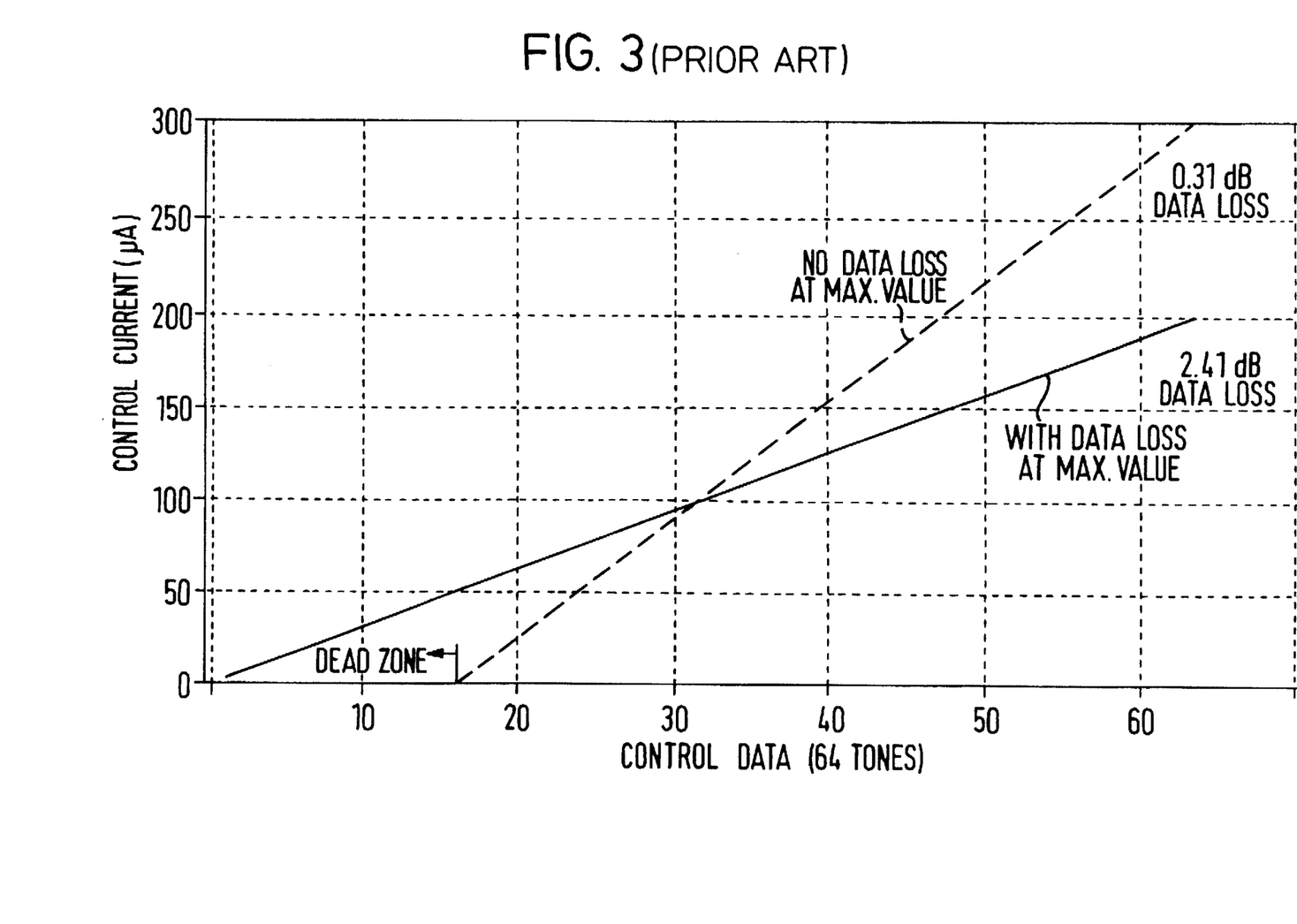
FIG. 3 is a diagram showing the control current characteristic of a conventional volume controller.

If the attenuation characteristic is set using Iref/Icont= 1.55 as an intermediate value as shown by the solid line in FIG. 3, the control current ICONT changes linearly. Therefore, minimum and maximum values are decided uniquely. Thus the maximum current ratio will become 0.775 while the amount of the attenuation will become 2.41 dB.

As shown by the dotted line in FIG. 3, if the attenuation characteristic is set so that the control current ICONT reaches its maximum value at three times its intermediate value the attenuation at the maximum value is improved to 0.31 dB. However, a problem arises when the minimum value of the control current ICONT does not correspond to the minimum volume level which falls outside the operation range causing the dead zone to extend up to near the intermediate value.

A method of addressing this problem is to increase the gain by increasing the value of the load resistor RL. However, considering thermal noise of resistors, impedance mismatch and the noise characteristic of feedback paths, this method is also problematic because increasing the load resistor RL deteriorates the noise characteristic and increases the residual noise.

In addition, an amount of a DC offset component, i.e., an error component of input and output signals, is increased by increasing the load resistance RL. Therefore, increasing the load resistance RL becomes disadvantageous to overall operating characteristic.

Further, decreasing the emitter resistance RE not only decreases the minimum input sensitivity, but also decreases the input dynamic range. Therefore, the bias current must be increased which results in further problems such as increased current consumption and increased DC offset.

After improving the attenuation rate based on the load resistor RL and the emitter resistor RE, there are still such problems that not much improvement is obtainable. Even at the maximum volume level there is a data loss (e.g., 2.91 dB) which increases the noise level. When the control current has a linear characteristic it is also impossible to improve the gain loss at the maximum volume without deteriorating circuit characteristics.

As described above, in the conventional circuit, as a sound volume is varied by linearly changing the control current, it is impossible to simultaneously improve such operating characteristics as reduction of the gain loss at the maximum volume, expansion of the input dynamic range, noise reduction, etc.

SUMMARY OF THE INVENTION

It is, therefore, an object of the present invention to provide a volume controller which compensates for the shortage of control current at a maximum volume level, suppresses gain loss and expands dynamic range.

In order to achieve this object, a volume controller according to a first aspect of the present invention includes a volume regulating circuit having an input terminal connected to an audio signal source and a control terminal to which a volume regulating voltage is supplied; a circuit for supplying parallel data in multiple bits; a D/A conversion circuit having multiple current circuits formed in parallel corresponding to each bit of the parallel data for ON/OFF controlling of the current circuits according to respective bit data and for supplying total sum current flowing through these current circuits; a control circuit for controlling output current from the D/A conversion circuit to non-linear current by switching current levels of respective current circuits corresponding to the most significant bit of the parallel data; and a circuit for generating the volume regulating voltage by converting the output current from the D/A conversion circuit into voltage.

Further to the first aspect of the invention a volume controller according to a second aspect of the present invention includes a first and a second transistors comprising a differential circuit by commonly connecting the emitters; a first constant current source connected to the emitters of the first and the second transistors, the base bias source for the first and the second transistors, and a circuit for switching the ON/OFF state of the first and the second transistors by controlling the base voltage of the first transistor corresponding to bit data; and the collectors of the first transistors of the current circuits connected to a DC voltage source and the collectors of the second transistors connected with each other to obtain the output current.

Further to the first aspect of the invention, a volume controller according to a third aspect of the present invention includes a third and a fourth transistors comprising a differential circuit by commonly connecting their emitters; a second constant current source connected to the emitters of the third and the fourth further transistors, the base bias source for the third and the fourth transistors; a circuit for switching the ON/OFF state of the third and the fourth transistors by controlling the base voltage of the third transistor corresponding to the most significant bit data; a first current mirror circuit connecting the input terminal to the collector of the third transistor and a second current mirror circuit to which the output current of this first current mirror circuit and the current from a third constant current source is supplied as an input current; and a current volume of respective current circuits is determined by the output current of the second current mirror circuit.

A volume controller according to a fourth aspect of the present invention includes a volume regulating circuit having an input terminal connected to an audio signal and a control terminal to which a volume regulating voltage is supplied; a circuit for supplying parallel data in multiple bits; a D/A conversion circuit including the parallel data supply circuit and multiple current circuits formed in parallel for every bit of the parallel data for setting currents flowing through the current circuits sequentially at different values and for supplying a total sum current flowing through these current circuits as the output; a control circuit for switching the magnitude of the currents from the current circuits corresponding to the most significant bit of parallel data and for controlling a change characteristic of the output current from the D/A conversion circuit to non-linear in a first and a second regions; and a circuit for generating the volume regulating voltage by converting the output current from the D/A conversion circuit into voltage.

According to the present invention it becomes possible to suppress the gain loss at the maximum volume level and expand the input dynamic range from the minimum volume level to the maximum volume level by appropriately setting a reference current in a D/A converter and controlling the reference current using a controller.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained and better understood by references to the following detailed description and accompanying drawings, wherein.

DESCRIPTION OF THE PREFERRED EMBODIMENTS

The present invention will be described in detail with references to FIGS. 4 through 11.

Figure 4:
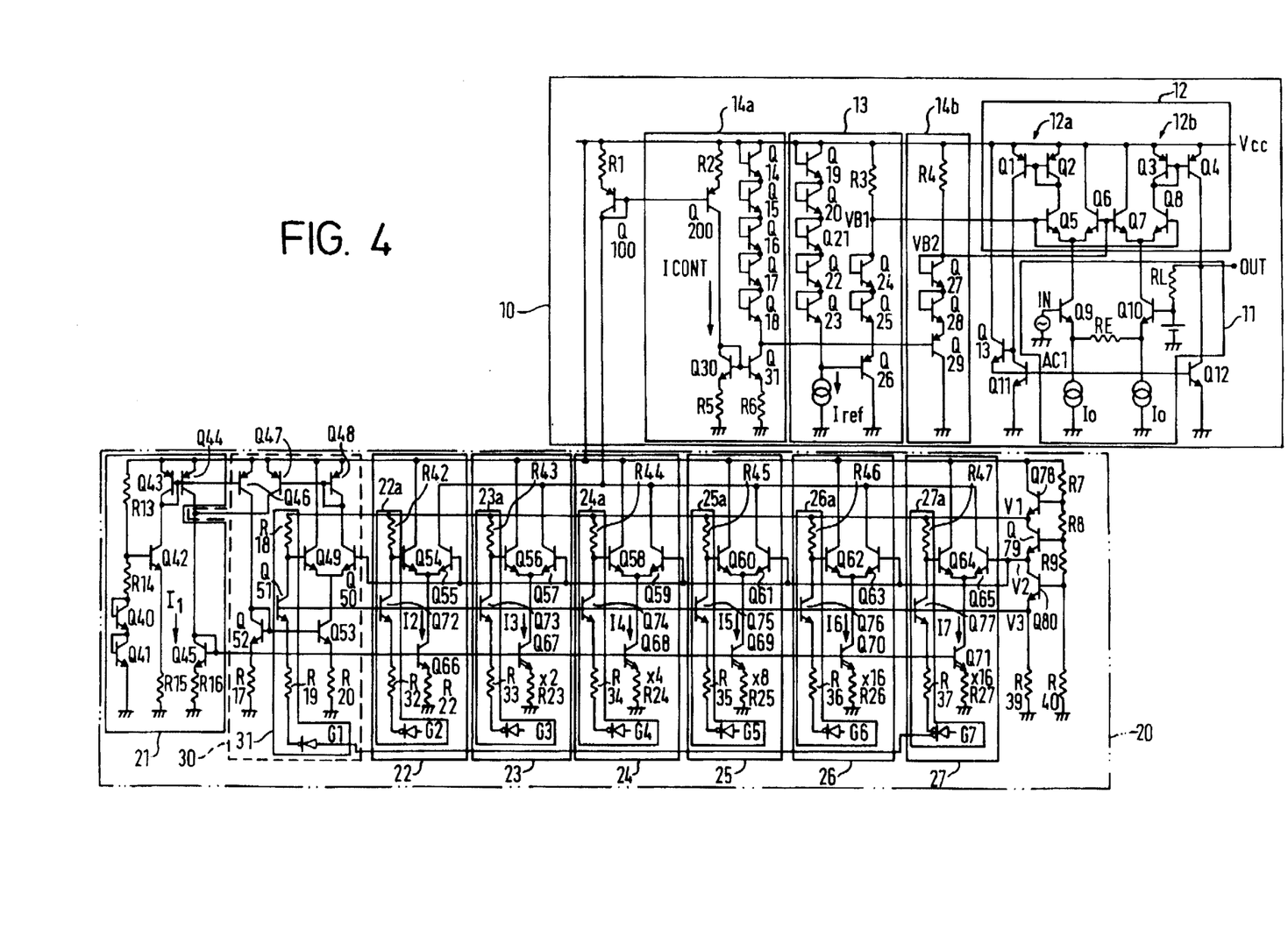
FIG. 4 is a circuit diagram showing one embodiment of the volume controller according to the present invention.

FIG. 4 is a preferred embodiment of a volume control circuit according to the present invention. The elements in FIG. 4 that are the same or similar elements as those in FIG. 2 are assigned the same reference numerals and explained with these reference numerals.

In FIG. 4, a volume control circuit is provided with a volume control circuit 10, a D/A converter 20 and a nonlinear controller 30 for controlling a control current with a nonlinear characteristic.

The column control circuit 10 is in the same structure as a conventional volume control circuit and control current is controlled by the nonlinear controller 30.

The nonlinear controller 30 is comprised of a constant current source and a switching circuit 31. The constant current circuit is comprised of a differential circuit provided with a pair of transistors Q49, Q50; a DC power source Vcc; transistors Q46, Q52, Q53 comprising a constant current source; resistors R17, R20; a transistor Q48 configured in a collector-base connected diode fashion, which is connected to the collector of the transistor Q50 of the differential circuit; and a transistor Q47 having the base connected to the base of the transistor Q48 and the collector connected to a reference current circuit 21.

The switching circuit 31 is connected to the base of a transistor Q49 of the differential circuit Q49/Q50, while a DC power source V2 is connected to the base of the other transistor Q50 of the differential circuit Q49/Q50.

The switching circuit 31 is comprised of another DC power source V1, a resistor R18, a switching transistor Q51, a resistor R19 and a gate circuit G1. The DC power source Vi is connected to the collector of the switching transistor Q51 via the resistor R18. The emitter of the transistor Q51 is then connected to a gate circuit G1, for instance, an open collector type inventor circuit, via the resistor R19. The base of the switching circuit Q51 is connected to another DC power source V3.

The switching circuit 31 is provided for receiving a most significant bit (hereinafter referred to as MSB) of a parallel data bus.

The reference current circuit 21 is comprised of a reference current source II, a diode-fashion transistor Q45 and a resistor R16. Further the reference current source Ii is comprised of a bias setting circuit and a transistor Q44.

The bias setting circuit is provided with a diode-fashion transistor Q43 connected to the base of the transistor Q44, an emitter-grounded transistor Q42, and a bias circuit for the transistor Q42 which is comprised of resistors R13, R14 and diode-fashion transistors Q40, Q41.

Further, the D/A converter 20 is provide with the nonlinear controller 30, the reference current circuit 21, constant current circuits 22–27 and the DC power source Vcc. Each of the constant current circuits 22–27 is provided for a corresponding bit of the parallel data bus. The sum of the constant current circuits 22–27 in the parallel data bus provide the control current ICONT. Further the control current value ICONT can be set for any constant current value of a least significant bit (hereinafter referred to as LSB). The constant current circuit 22 corresponds to the LSB, while the constant current circuit 27 corresponds to the MSB. The constant current circuits 22–27 include constant current sources I2–I7, respectively, which are comprised of transistors Q45–65 coupled in five sets of differential circuits, switching circuits 22a–27a, resistors R22–R27 and transistors Q66–Q71.

Starting from the constant current source I2, currents with two times value are sequentially set in the constant current sources I2–I7, thus for example a current with 16 times the current of I2 is set for the constant current source I6.

The constant current circuits 22–27 for respective bits are connected to the DC power source Vcc via a diode-fashion transistor Q100 and the resistor R1 in order to control the control current value ICONT of the volume control circuit 10.

The diode-fashion transistor Q100 is connected to the base of a transistor Q200 of the control current setting circuit 14a. Thus the control current ICONT flows from the DC power source Vcc via the emitter-collector path of the transistor Q200 in response to the change in the current from the D/A converter 20. The control current ICONT sets the base voltage VB2 on the bases of the transistors Q6 and Q7 in the adjacent differential circuits Q5/Q6 and Q7/Q8 in the bias setting circuit 12 connected to the collectors of the transistors Q9, Q10 of the differential amplifier circuit 11.

The operation of the volume control circuit 10 of FIG. 4 is understood by referring to FIG. 2.

Figure 5:
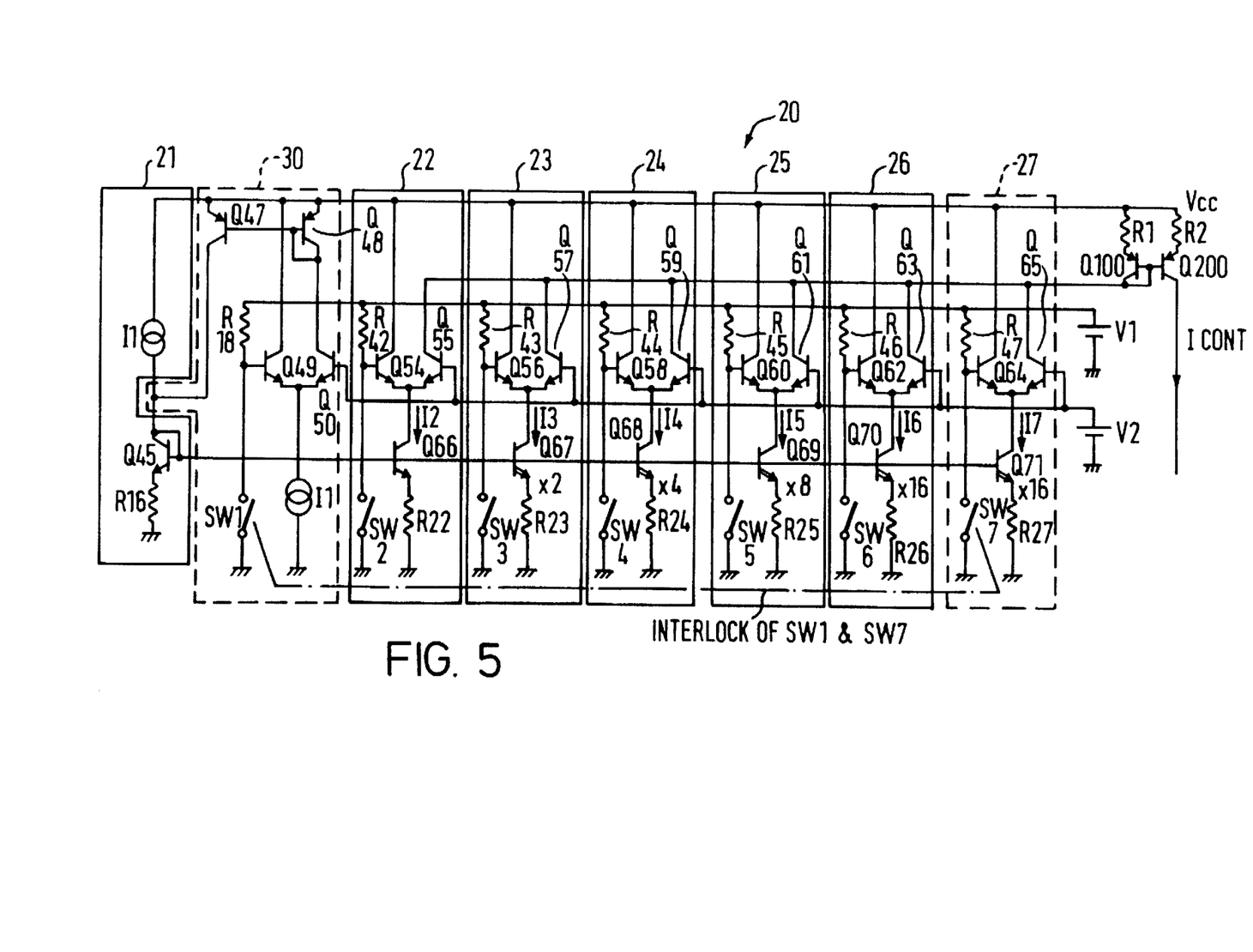
FIG. 5 is a diagram for explaining the operation of the D/A converter shown in FIG. 4.
Figure 6:
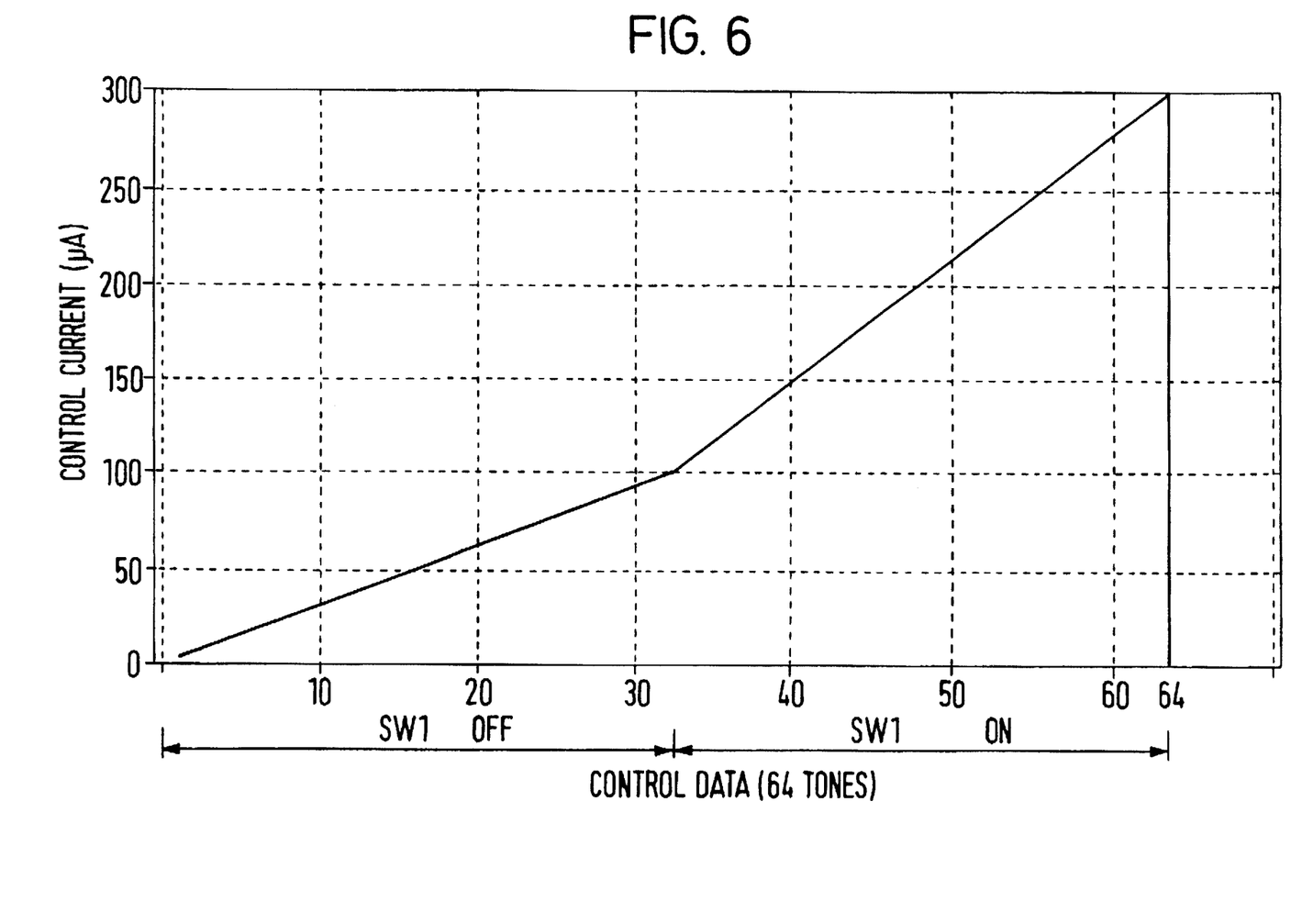
FIG. 6 is a diagram showing the control current characteristic of the volume controller shown in FIG. 4.

FIG. 5 is an explanatory diagram illustrating the operation of the D/A converter of the volume control circuit shown in FIG. 4. FIG. 6 is a graph showing the control current characteristic of the circuit shown in FIG. 5.

In FIG. 5, the current sources in the reference current circuit 21 and the nonlinear controller 30 are shown by I2–I7 and I1. The switching circuit 31 in the nonlinear controller 30 and the switching circuits 22a–27a in the constant current circuits 22–27 are shown by the switches SW1–SW7, respectively. The ON/OFF states of the switches SW1–SW7 are controlled by parallel bit data. The LSB of a 6-bit data is supplied to the switch SW2, while the other bits higher than the LSB are sequentially supplied to the switches SW3–SW6. Thus the MSB data is supplied to the switch SW7.

Each of the switches SW1–SW7 are turned ON when their corresponding data bit is "1", or turned OFF when the corresponding data bit is "0". Further, it is so provided that the values of the constant current sources I2, I3, . . . I6 sequentially increase by two times such that I3=2×I2, I4=2× I3, . . . I6=2×I5.

In FIG. 5, if the bit data supplied to the switches SW1–SW7 are all "0", the switches SW1–SW7 are turned OFF so that the transistors Q49, Q54, Q58, Q60, Q62 and Q64 are turned ON. While in that state with the transistors Q50, Q55, Q57, Q59, Q61, Q63 and Q65 being left in the OFF state, no current flows through the transistor Q100. Accordingly, the control current is set to zero current. Further when only the least significant bit (LSB) is "1", only the switch SW2 in the constant current circuit 22 is turned ON. As a result a current equal to the current I2 flows through the transistor Q100.

In the same manner, the constant current I3–I6 flow through the transistor Q100, in response to the corresponding bit data applied thereto. That is, the total amount of the currents I3–I6 flows through the transistor Q100.

Further, when the most significant bit (MSB) becomes "1", the switches SW1 and SW67 are turned ON. Then the transistor Q49 is turned OFF but the transistor Q50 is turned ON. Thus a current flows through the transistor Q45 based on the current-mirror connection due to the current mirrors Q48, Q47 between the transistor Q45 and Q50. The current of the transistor Q45 is given by the sum of the constant current I1 and the current flowing through the transistor Q47. Accordingly, the current becomes twice the amount of the constant current I1. Then, currents flowing through the transistors Q66, Q67, Q68, Q69, Q70 and Q71 which constitute similar current-mirrors, respectively, in connection with the transistor Q45, become also twice the constant current I1. When the MSB becomes "1" (the medium point of 64 tones), the current flowing through the transistor Q100 so increases that the control current ICONT has a characteristic as shown in FIG. 6.

If the current flowing through transistor Q45 in the referenced circuit 21 is 100 μA when switch SW1 is OFF the minimum current value of the D/A converter 20 (i.e., the resolution of the D/A converter 20) is a value obtained by dividing the reference current value by the number of data values that can be achieved using all bits but the MSB of the parallel data; that is, a value given by 100÷=3.135 μA for six bit data. On the other hand, when the switch SW1 is ON, that is, the MSB is high, the reference current becomes 200 μA, a sum with the current value 100 μA of the constant current circuit and the minimum current set value of the D/A converter 20 will become the value given by 200÷=6.25 μA. Thus, it becomes possible to obtain the control current characteristic, as shown in FIG. 6, by turning OFF the switch SW1 for the lower volume range and turning ON the switch SW1 for the volume range from the medium volume to the maximum volume.

Figure 7:
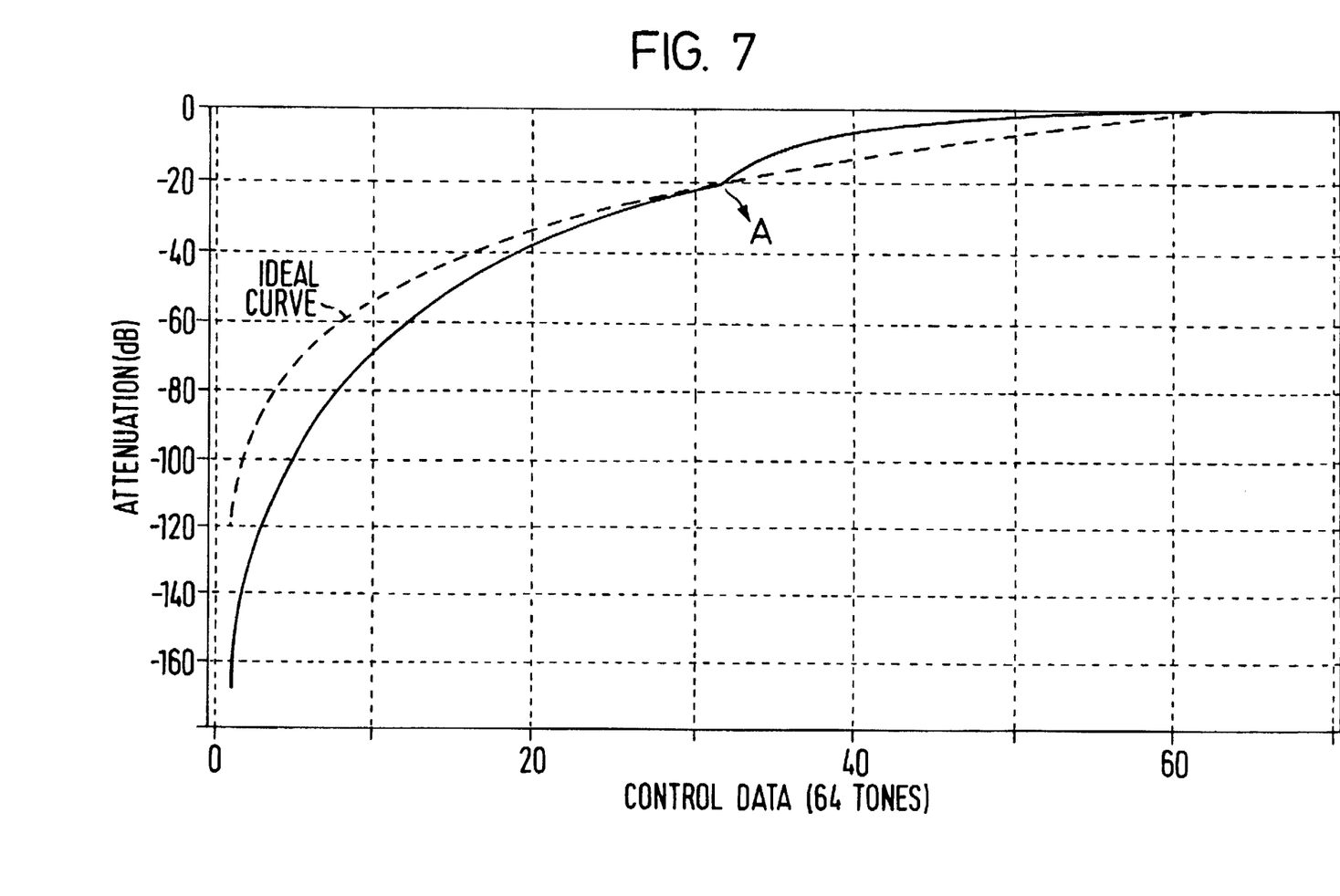
FIG. 7 is a diagram showing the volume characteristic of the volume controller shown in FIG. 4.

Further, an exemplified volume characteristic, as shown in FIG. 7, is also obtained. An attenuation of 20 dB is achieved at a point around the medium section. At the maximum volume it becomes possible to flow a current of 300 μA determined by the total sum of all bits. Thus, the gain loss at the maximum volume can be reduced. The dotted line in the graph plots an ideal volume characteristic curve and the solid line plots a volume characteristic curve of the embodiment of the volume control circuit according to the present invention. Point A indicates the changing point of the ON and OFF areas of the switch SW1.

Figure 8:
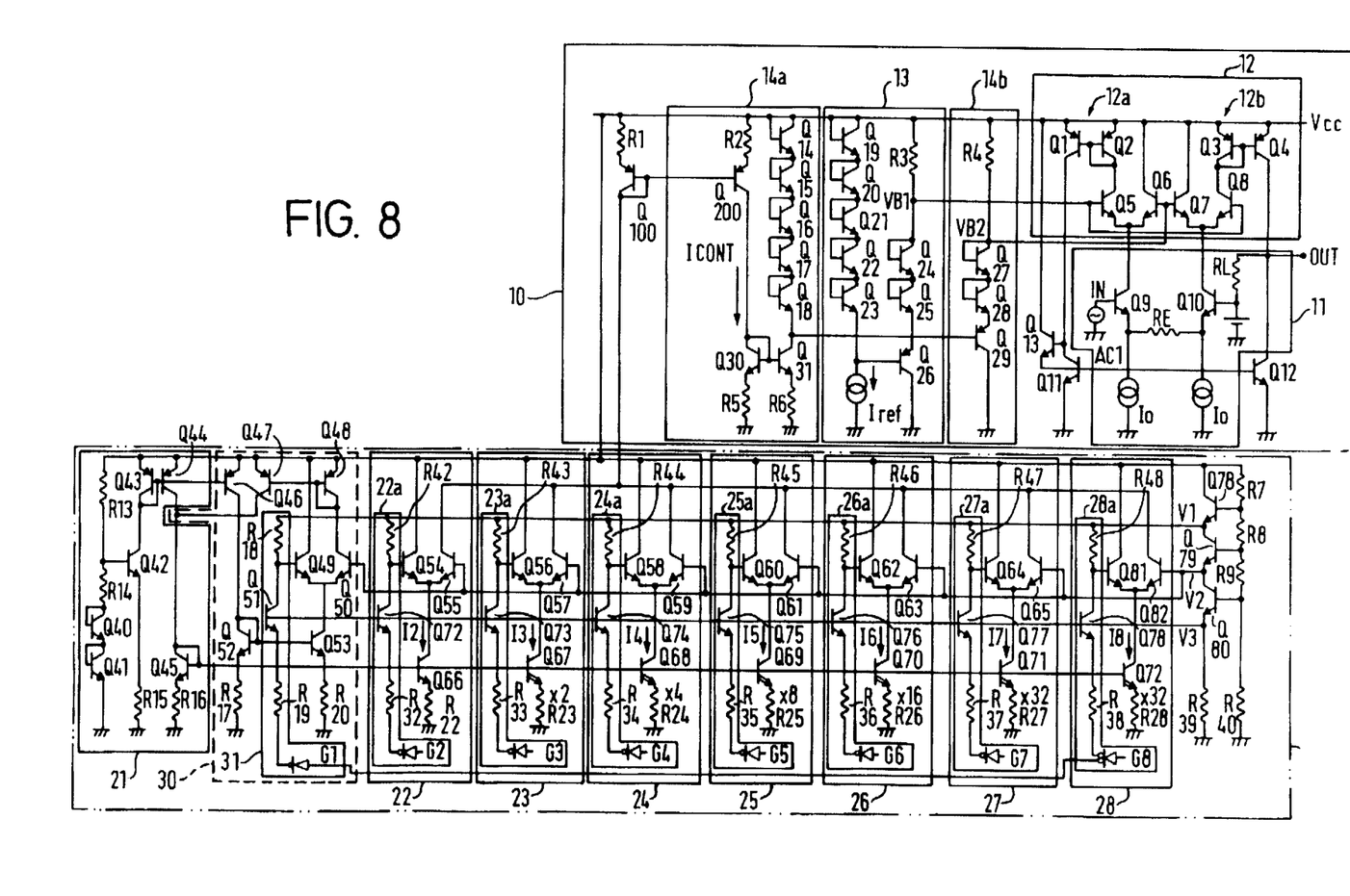
FIG. 8 is a circuit diagram showing another embodiment of the volume controller according to the present invention.

FIG. 8 shows another preferred embodiment of the present invention. This is an example of data modified from the 6-bit data to a 7-bit data. Except that a circuit for one bit is added, this embodiment is entirely the same as the embodiment as already described above. That is, a constant current circuit 28 (including transistors Q78, Q81 and Q82) associated with the MSB of the 7-bit data is newly added.

According to the above arrangement, it becomes possible to increase data values presented by the parallel data and thus increase a current value at the maximum volume level. Thus the gain loss is further decreased.

Figure 9:
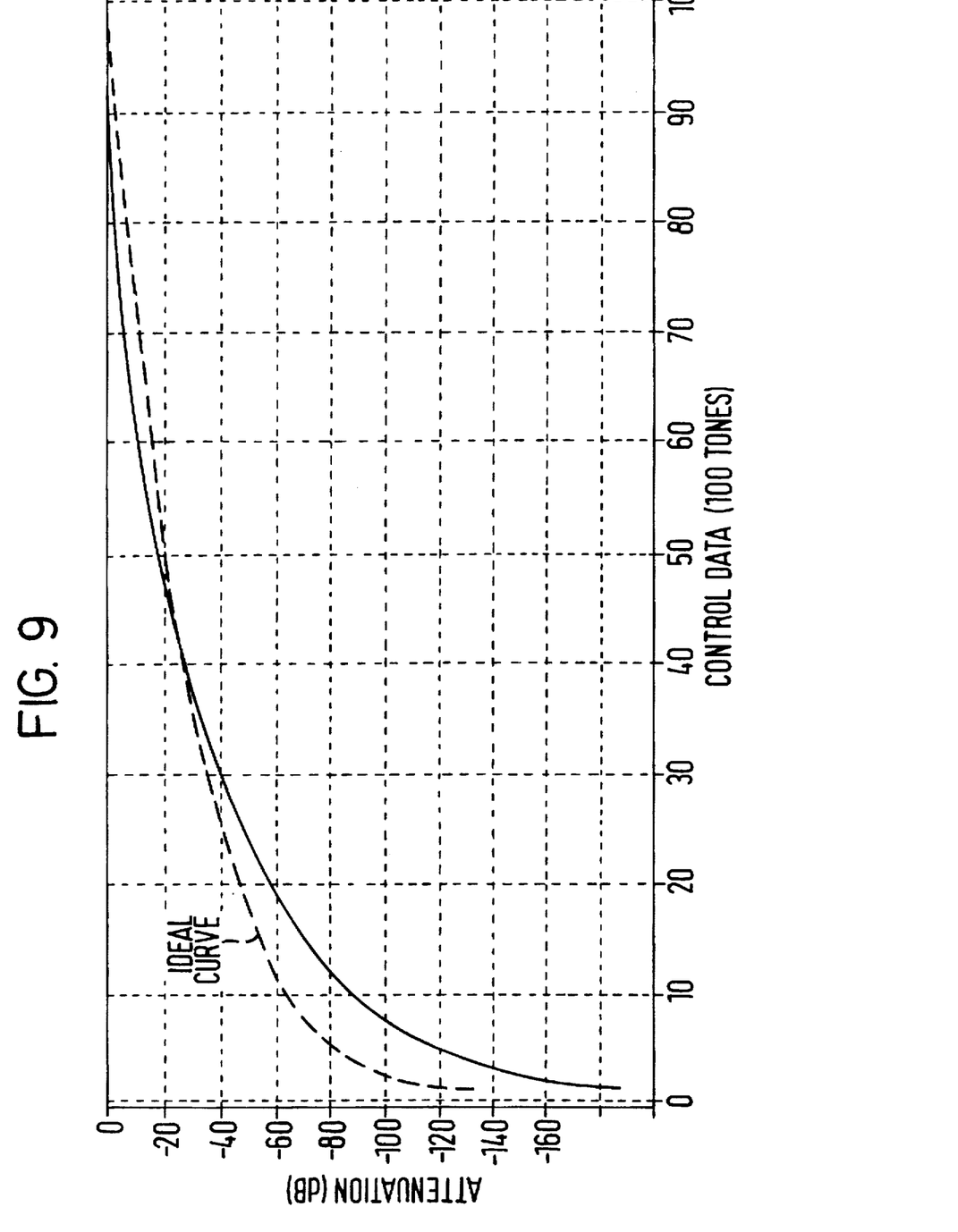
FIG. 9 is a diagram showing the volume characteristic of the volume controller shown in FIG. 8.

FIG. 9 shows a graph illustrating the volume control characteristic of the second embodiment of FIG. 8. This graph shown an example of using 100 tones out of 128 data values presented by the 7-bit data. The dotted line in the graph plots an ideal level characteristic, while the solid line plots a practical volume level characteristic of the second embodiment.

Figure 10:
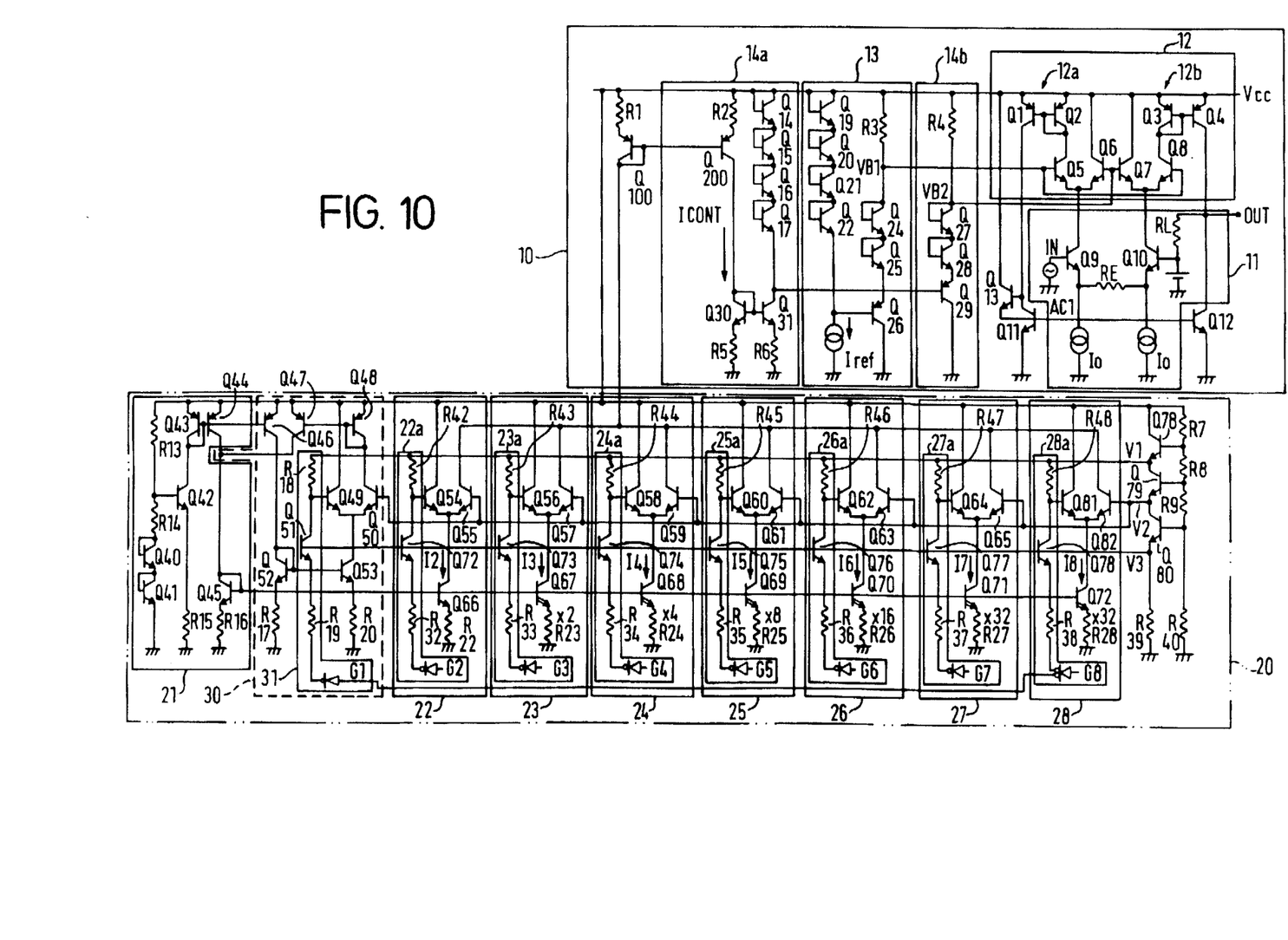
FIG. 10 is a circuit diagram showing another embodiment of the volume controller according to the present invention.
Figure 11:
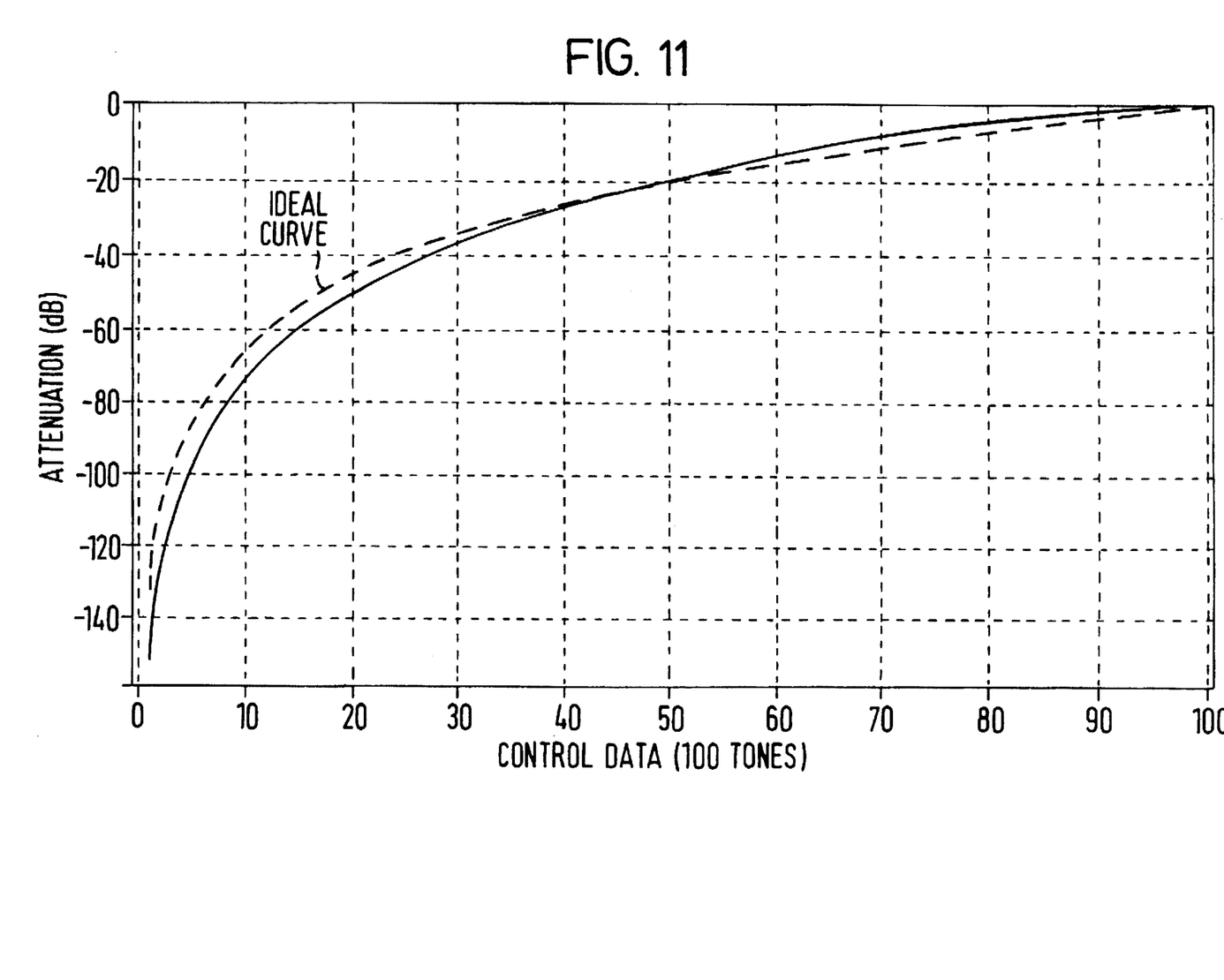
FIG. 11 is a diagram showing the volume level characteristic of the volume controller shown in FIG. 10.

Further, FIG. 10 shows a third embodiment of the volume controller according to the present invention, in which two series of four stack-connection diodes Q14–Q17 and Q19–Q22 are used in the circuits associated with the residual sound, in place of the five stack-connection diodes Q14–Q18 and Q19–Q23. In this case, a gain is calculated by changing the exponential portion of Expression 3 in the conventional embodiment from 5 to 4. Although the circuit size of this embodiment increases as required to the embodiment in FIG. 4, the lower volume area characteristic is also improved as shown in FIG. 11.

The effect of the characteristic enhancement resulting form the improvement of amplifiers in the volume controller according to the present invention are presented in the following table.

| ITEM | BEFORE IMPROVEMENT | AFTER IMPROVEMENT | IMPROVING RATE |
|---|---|---|---|
| Load resistance | 14.2 K$\Omega$ | 2.0 K$\Omega$ | — |
| Noise level | 1.84 E-5 V | 1.39 E-5 V | 2.44 db |
| Residual noise | 1.52 E-8 V | 1.84 E-5 V | 0.71 db |
| Offset | 42 mV | 38 mV | 9.5% |

As seen from the above table, as a result of the improvement of the amplifier efficiency, not only is the characteristic deterioration caused by the improvement of load resistances or emitter resistances eliminated, but it is possible to reduce the load resistance. In the embodiments as described above, the noise level caused by load resistance has been highly reduced (Improving rate: 2.44 dB). The DC offset has been highly reduced (Improving rate: 9.5%). Also the residual noise has been reduced (Improvement rate: 0.71 dB).

As described above, the present invention can provide an extremely preferable volume controller. That is, the volume controller according to the present invention is able to improve the S/N, reduce the residual noise and reduce the DC offset by controlling the performance of the amplifier circuit in the volume control circuit by non-linearly setting the control current.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

The foregoing description and the drawings are regarded by the applicant as including a variety of individually inventive concepts, some of which may lie partially or wholly outside the scope of some or all of the following claims. The fact the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a divisional application.

What is claimed is:

1. A volume controller comprising:

a volume regulating circuit having an input terminal connected to an audio signal source and a control terminal to which a volume regulating voltage is supplied;

means for supplying parallel data in multiple bits;

a D/A conversion circuit, including multiple current circuits formed in parallel, each of said current circuits corresponding to a respective bit of the parallel data and each of said current circuits having a respective current level flowing there through, for ON/OFF controlling the current circuits according to respective bits of the parallel data and for supplying a D/A output current, the D/A output current being a total sum of the current levels flowing through the current circuits;

control means for controlling the D/A output current, so that the D/A output current is a non-linear current, by switching the current level of each current circuit based on the most significant bit of the parallel data; and means for generating the volume regulating voltage by converting a current level of the D/A output current into a voltage level.

2. The volume controller as in claim 1, wherein:

each of the current circuits comprises:

a first transistor and a second transistor comprising a differential circuit by commonly connecting an emitter of the first transistor to an emitter of the second transistor to form an emitter connection, a constant current source connected to the emitter connection, a base bias source for the first transistor and the second transistor and means for switching an ON/OFF state of the first transistor and the second transistor by controlling a base voltage of the first transistor corresponding to a respective bit of the parallel data;

the collectors of the first transistors of the current circuits are connected to a DC voltage source; and collectors of the second transistors of the current circuits are connected with each other to obtain the D/A output current.

3. The volume controller as in claim 1, wherein the control means includes:

a first transistor and a second transistor comprising a differential circuit by commonly connecting an emitter of the first transistor with an emitter of the second transistor to form an emitter connection, a first constant current source connected to the emitter connection, a base bias source for the first transistor and the second transistor, means for switching an ON/OFF state of the first transistor and the second transistor by controlling a base voltage of the first transistor corresponding to the most significant bit of the parallel data, a first current mirror circuit connecting the input terminal to a collector of the first transistor, a second constant current source, and a second current mirror circuit to which an output current of the first current mirror circuit and a current from the second constant current source is supplied as an input current, wherein an output of the second current mirror circuit determines the current level of respective current circuits.

4. A volume controller comprising:

a volume regulating circuit having an input terminal connected to an audio signal and a control terminal to which a volume regulating voltage is supplied;

means for supplying parallel data in multiple bits;

a D/A conversion circuit including the parallel data supply means and multiple current circuits formed in parallel, each of said current circuits corresponding to a respective bit of the parallel data, for setting currents flowing through the current circuits sequentially at different levels and for supplying a total sum current flowing through these current circuits as a D/A output current;

control means for switching the levels of the currents of the current circuits based on the most significant bit of the parallel data and for controlling a change characteristic of the D/A output current to non-linear in a first region and a second region; and means for generating the volume regulating voltage by converting a current level of the D/A output current into a voltage level.

* * * * *